US009521774B2

(12) United States Patent
Liang et al.

(10) Patent No.: US 9,521,774 B2
(45) Date of Patent: Dec. 13, 2016

(54) HANDLE LOCKING STRUCTURE AND ELECTRONIC DEVICE HAVING HANDLE LOCKING STRUCTURE

(71) Applicant: Huawei Technologies Co., Ltd., Shenzhen, Guangdong (CN)

(72) Inventors: Xufei Liang, Shenzhen (CN); Guangming Zheng, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 119 days.

(21) Appl. No.: 14/575,782

(22) Filed: Dec. 18, 2014

(65) Prior Publication Data
US 2015/0156912 A1 Jun. 4, 2015

Related U.S. Application Data

(63) Continuation of application No. PCT/CN2013/070910, filed on Jan. 24, 2013.

(30) Foreign Application Priority Data

Jun. 27, 2012 (CN) .......................... 2012 1 0214683

(51) Int. Cl.
H05K 5/02 (2006.01)
H05K 7/14 (2006.01)
(Continued)

(52) U.S. Cl.
CPC ............... H05K 7/1411 (2013.01); E05B 1/00 (2013.01); E05B 65/46 (2013.01); E05C 1/08 (2013.01);
(Continued)

(58) Field of Classification Search
CPC ..... G06F 1/187; H05K 7/1411; H05K 7/1415; H05K 7/1489; H05K 5/0221; H05K 5/023; E05B 1/00; E05B 65/46; E05C 1/08; E05C 1/12
See application file for complete search history.

(56) References Cited

U.S. PATENT DOCUMENTS 6,246,585 B1 * 6/2001 Gunther ............... H05K 7/1409
361/756
7,175,470 B2 * 2/2007 Kangas ............... H05K 7/1411
439/160
(Continued)

FOREIGN PATENT DOCUMENTS

CN 2763883 Y 3/2006
CN 201449585 U 5/2010
(Continued)

Primary Examiner — Courtney Smith
Assistant Examiner — Keith Depew

(57) ABSTRACT

The present invention is applied to the field of technologies about a handle structure in an electronic device, and discloses a handle locking structure and an electronic device having the handle locking structure. The handle locking structure includes a handle body that is connected to a shell, and a pressing member, a transmission member, and a locking part that are connected to the handle body in a sliding or rotating manner, where the locking part includes a bolt, the transmission member is connected to the pressing member, an unlocking structure that is used to enable the bolt to retract is disposed between the transmission member and the locking part, the transmission member is connected to the bolt through the unlocking structure, the transmission member can slide by pressing the pressing member, and the sliding transmission member functions on the bolt through the unlocking structure to enable the bolt to retract.

12 Claims, 12 Drawing Sheets

(51) Int. Cl.
*E05C 1/08* (2006.01)
*E05B 65/46* (2006.01)
*E05C 1/12* (2006.01)
*E05B 1/00* (2006.01)

(52) U.S. Cl.
CPC ............... *E05C 1/12* (2013.01); *H05K 5/023* (2013.01); *H05K 5/0221* (2013.01); *H05K 7/1415* (2013.01); *H05K 7/1489* (2013.01); *Y10T 292/097* (2015.04)

(56) References Cited

U.S. PATENT DOCUMENTS

| | | | |
|---|---|---|---|
| 8,553,404 B2* | 10/2013 | Lin | G06F 1/187 |
| | | | 248/274.1 |
| 2006/0146490 A1 | 7/2006 | Chen et al. | |
| 2009/0080165 A1* | 3/2009 | Barina | H05K 7/1411 |
| | | | 361/747 |
| 2011/0273850 A1* | 11/2011 | Chen | H05K 5/0221 |
| | | | 361/726 |
| 2013/0044440 A1* | 2/2013 | Hingrainer | H05K 5/0221 |
| | | | 361/747 |
| 2013/0106261 A1* | 5/2013 | Kuan | H05K 5/0221 |
| | | | 312/223.1 |
| 2014/0184040 A1* | 7/2014 | Li | H05K 5/023 |
| | | | 312/223.1 |

FOREIGN PATENT DOCUMENTS

| | | |
|---|---|---|
| CN | 201717542 U | 1/2011 |
| JP | 2004014824 A | 1/2004 |

* cited by examiner

HANDLE LOCKING STRUCTURE AND ELECTRONIC DEVICE HAVING HANDLE LOCKING STRUCTURE

CROSS-REFERENCE TO RELATED APPLICATIONS

This application is a continuation of International Application No. PCT/CN2013/070910, filed on Jan. 24, 2013, which claims priority to Chinese Patent Application No. 201210214683.1, filed on Jun. 27, 2012, both of which are hereby incorporated by reference in their entireties.

TECHNICAL FIELD

The present invention belongs to the field of technologies about a handle structure in an electronic device, and in particular, relates to a handle locking structure having a locking function and an electronic device having the handle locking structure.

BACKGROUND

Currently, an electronic device, such as a rack server, includes a rack and a subrack, where the subrack is inserted into the rack. For ease of pulling the subrack out of the rack, a handle is disposed on a shell of the subrack for holding. To prevent the subrack from loosening, a buckle structure is disposed on the subrack. If the subrack needs to be pulled out of the rack, an operator needs to unfasten the buckle structure with one hand, and pull the subrack out of the rack with the other hand by using the handle, which causes an inconvenient operation. Most of handles in electronic devices in the prior art are formed by bending and soldering stainless steel round rods on shells of subracks, which are inconvenient for a user to use.

SUMMARY

The present invention is intended to overcome the foregoing disadvantages of the prior art and provide a handle locking structure and an electronic device having the handle locking structure. Operations on the handle locking structure and the electronic device having the handle locking structure are convenient, which are easy for a user to use.

A technical solution of the present invention is as follows: A handle locking structure is provided, including a handle body that is connected to a shell, and further including a pressing member that is connected to the handle body in a sliding or rotating manner, and a transmission member and a locking part that can slide against the shell, where the locking part includes a bolt that elastically stretches out of an outer peripheral wall of the shell, the transmission member is connected to the pressing member, an unlocking structure that is used to enable the bolt to retract is disposed between the transmission member and the locking part, the transmission member is connected to the bolt through the unlocking structure, the transmission member can slide by pressing the pressing member, and the sliding transmission member functions on the bolt through the unlocking structure to enable the bolt to retract.

The present invention further provides an electronic device, including a rack, where a subrack that can be pulled out of the rack is disposed on the rack, the foregoing handle locking structure is disposed on the subrack, and a lock hole that is used by the bolt for snapping is opened on the rack.

The present invention is intended to overcome the foregoing disadvantages of the prior art and provide a handle locking structure and an electronic device having the handle locking structure. A pressing member is disposed on a handle body, so that an operator can press the pressing member to drive a transmission member to slide, and the sliding transmission member functions on a bolt through an unlocking structure to enable the bolt to retract. An unlocking operation is simple and can be performed with one hand. An operation comfort degree is high and operation feel is good, which is beneficial for improving product quality.

DETAILED DESCRIPTION

To make the objectives, technical solutions, and advantages of the present invention more clearly, the following describes the present invention in further detail with reference to the accompanying drawings and embodiments. It should be understood that the described specific embodiments are merely intended for explaining the present invention rather than limiting the present invention.

Embodiment 1

A handle locking structure provided in this embodiment of the present invention can be applied to an electronic device, such as a server and a communications device. The electronic device may include a rack and a subrack, where the subrack is disposed on the rack.

Figure 1:
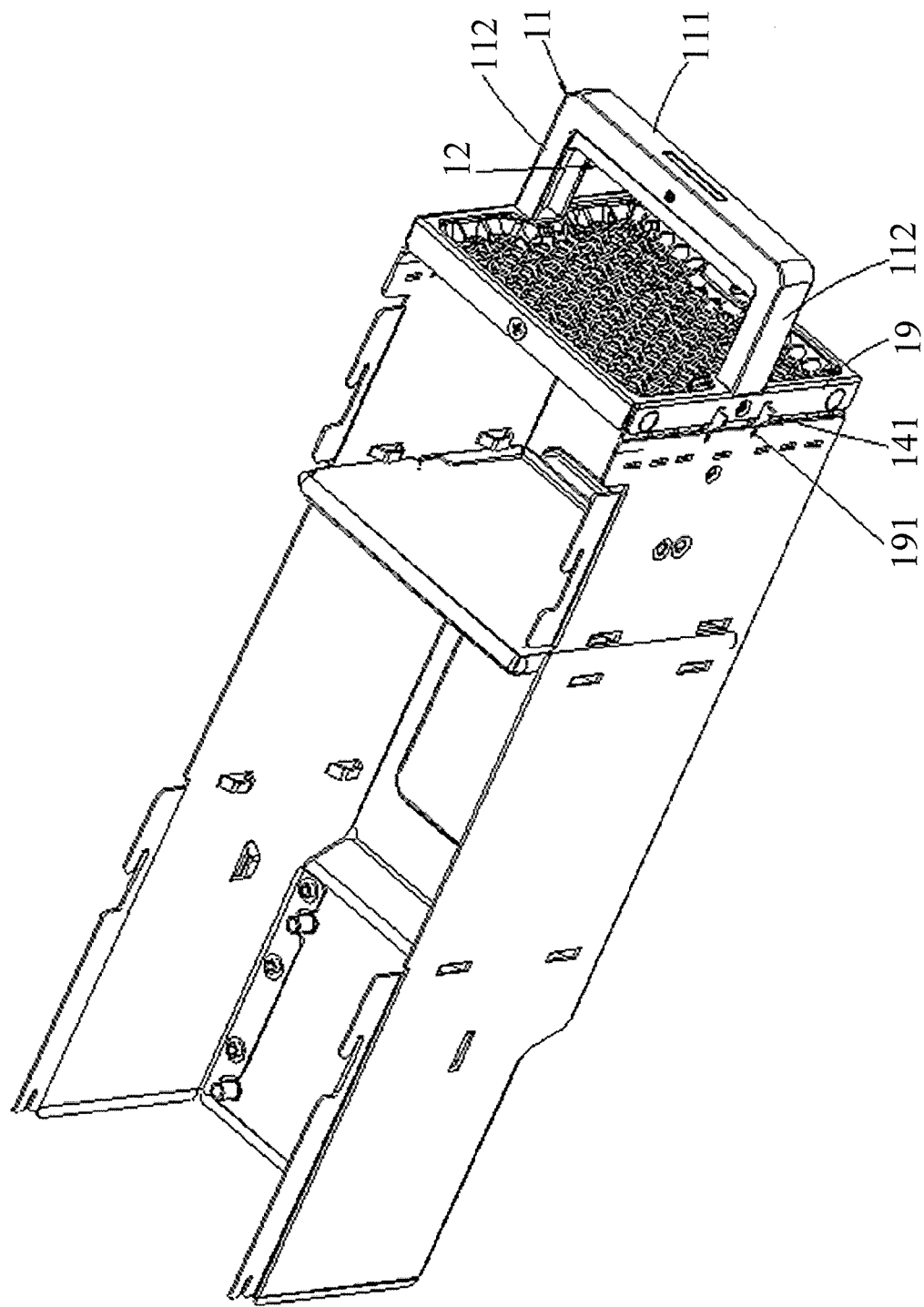
FIG. 1 is an assembly stereogram of a handle locking structure according to Embodiment 1 of the present invention.
Figure 2:
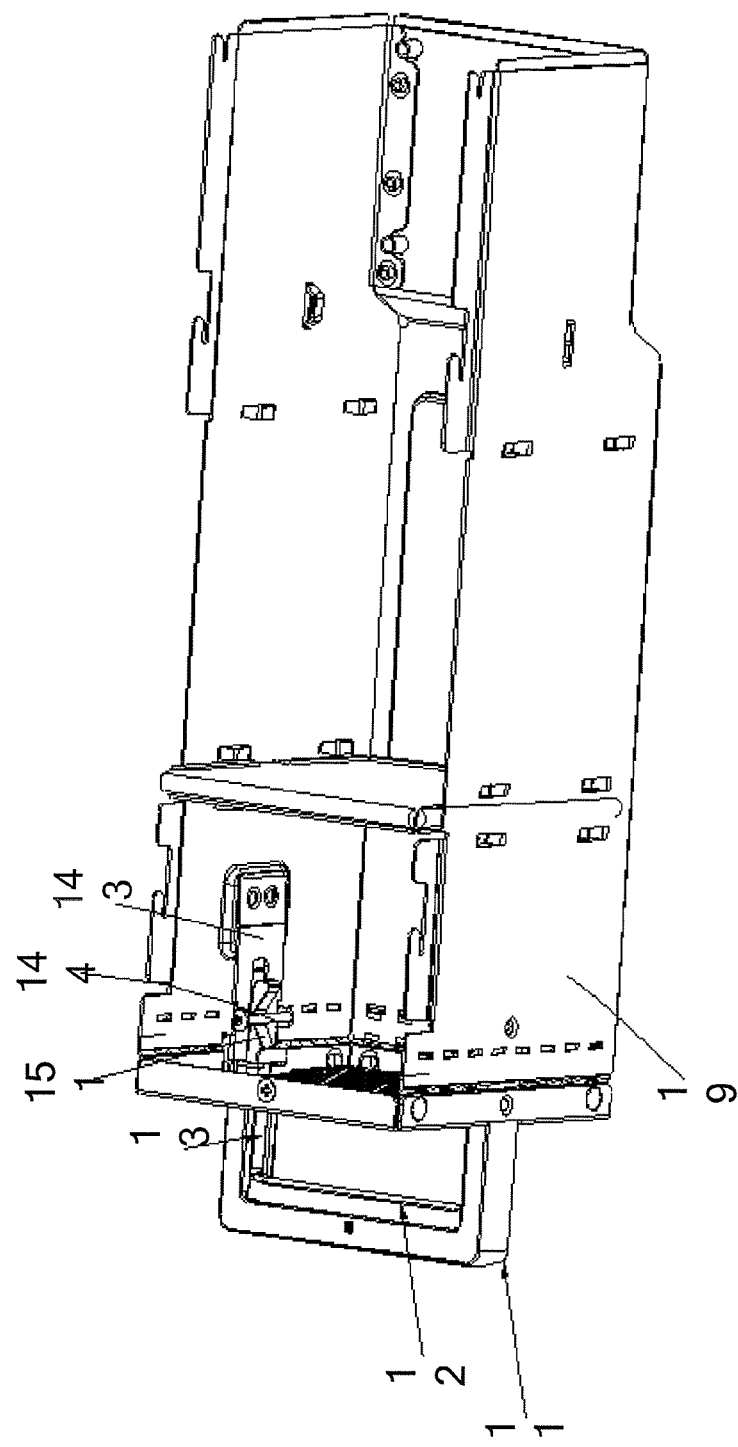
FIG. 2 is another assembly stereogram of a handle locking structure according to Embodiment 1 of the present invention.

As shown in FIG. 1 and FIG. 2, the foregoing handle locking structure includes a handle body 11, a pressing member 12, a transmission member 13 that is connected to the pressing member 12, and a locking part that can be driven by the transmission member 13.

As shown in FIG. 1 and FIG. 2, the handle body 11 may be connected to a shell 19 of the subrack in a fixed manner. An operator can hold the handle body 11, so as to insert the subrack into the rack or pull the subrack out of the rack. The pressing member 12 is connected to the handle body 11 in a sliding or rotating manner. The operator can conveniently press the pressing member 12 when holding the handle body 11. The operation can be performed with one hand and therefore the operation is easy and convenient. The transmission member 13 may be driven by the pressing member 12 and can slide against the shell 19. The transmission member 13 may be presented in a pole shape and is disposed between the pressing member 12 and the locking part. Definitely, the transmission member 13 may also be a proper member, such as a cable. In a specific application, the pressing member 12 may be connected to the handle body 11 in a rotating manner. Specifically, the pressing member 12 may be connected to the handle body 11 by means of rotation of a pin shaft. One end of the transmission member 13 may be connected to one end of the pressing member 12 by means of rotation of the pin shaft. When the pressing member 12 is pressed or released, the transmission member 13 can slide in a direction that is close to the locking part or a direction that is far away from the locking part, so that the locking part is in an unlocking or locking state.

As shown in FIG. 1 and FIG. 2, the locking part includes a bolt 141 that elastically stretches out of an outer peripheral wall of the shell 19, and correspondingly, a lock hole cooperating with the bolt 141 may be opened on the rack.

Figure 3:
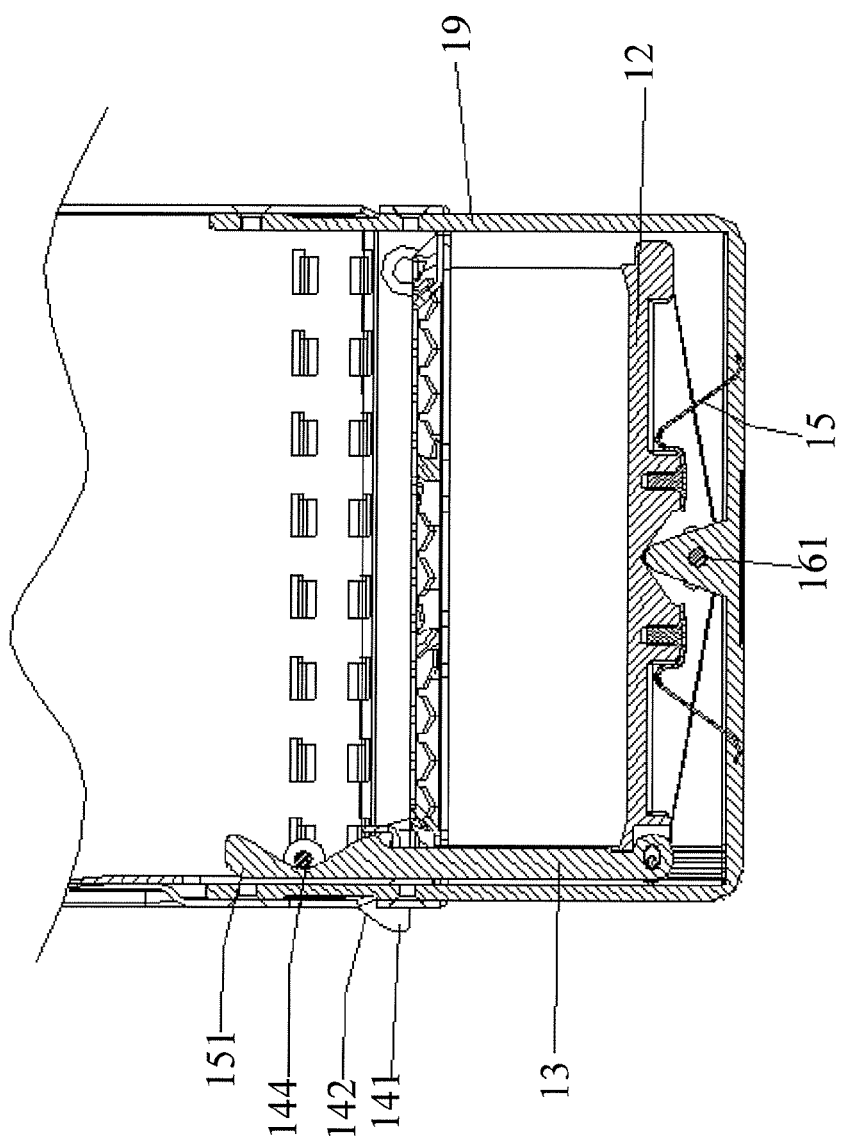
FIG. 3 is a sectional diagram of a handle locking structure according to Embodiment 1 of the present invention.

Specifically, as shown in FIG. 2 and FIG. 3, one end of the transmission member 13 is connected to the pressing member 12, and an unlocking structure that is used to enable the bolt 141 to retract is disposed between the other end of the transmission member 13 and the locking part. The transmission member 13 is connected to the bolt 141 through the unlocking structure. The operator can enable the transmission member 13 to slide by pressing the pressing member 12, and the sliding transmission member 13 functions on the bolt 141 through the unlocking structure to enable the bolt 141 to retract.

In a normal condition, the bolt 141 can snap into the lock hole, and the subrack may be kept in a locking state. If the subrack needs to be pulled out of the rack, the operator only needs to hold the handle body 11 and press the pressing member 12. The pressing member 12 enables the transmission member 13 to slide, and the sliding transmission member 13 enables, through the unlocking structure, the bolt 141 to retract, so that the bolt 141 can exit from the lock hole and the operator can pull out the subrack by using the handle body 11 again.

Further, as shown in FIG. 2 and FIG. 3, an elastic restoring part 15 is disposed between the pressing member 12 and the handle body 11. When the operator presses the pressing member 12, the elastic restoring part 15 is elastically compressed, and the pressing member 12 enables, through the transmission member 13 and the unlocking structure, the bolt 141 to exit from the lock hole. The bolt 141 is in an unlocking state, and the subrack can be pulled out of the rack. After the operator's hand leaves the handle body 11 or releases the pressing member 12, the pressing member 12 can restore to an original position in time under the action of the elastic restoring part 15, and the bolt 141 can stretch out of the outer peripheral wall of the shell 19 again, so that the bolt 141 is kept in a locking state. Because the elastic restoring part 15 is disposed between the pressing member 12 and the handle body 11, it is also easy for the operator to sense whether the pressing member 12 is pressed properly or restores in time. Operation feel is good. The operator can accurately sense whether the bolt 141 is in a locking state or an unlocking state. The elastic restoring part 15 may be a stainless steel elastic sheet, a spring, or the like. It may be understood that, one, two, or multiple elastic restoring parts 15 may be disposed.

In a specific application, the disposing of the elastic restoring part 15 may be canceled, and the pressing member 12 may restore by depending on elasticity of the bolt 141, which also falls within the protection scope of the present invention.

Specifically, as shown in FIG. 2, a guiding slope 142 may be disposed on a side of the bolt 141. When the subrack is pushed into the rack, the guiding slope 142 may provide a guiding function to enable the bolt 141 to retract elastically. When the bolt 141 is aligned with the lock hole, the bolt 141 can snap into the lock hole.

Specifically, as shown in FIG. 2 and FIG. 3, the handle body 11 includes a handheld horizontal section 111 and a connecting longitudinal section 112 that connects the handheld horizontal section 111 and the shell 19, and the handheld horizontal section 111 and the connecting longitudinal section 112 can be integrally formed. The handheld horizontal section 111 and the shell 19 are disposed oppositely. An assembly slot is opened on one side of the handheld horizontal section 111, where the side of the handheld horizontal section 111 is opposite to the shell 19, and the pressing member 12 is disposed in the assembly slot, which is equivalent to that the pressing member 12 is disposed in an inner side of the handle body 11. Therefore, a case in which the bolt 141 is in an unlocking state caused by mistakenly pressing the pressing member 12 is not easy to occur, and reliability is high.

Specifically, as shown in FIG. 1 to FIG. 3, the pressing member 12 protrudes out of the assembly slot, and the operator can press the pressing member 12 conveniently; and the transmission member 13 may be disposed along the connecting longitudinal section 112 and stretches into the shell 19, or the transmission member 13 may be movably sleeved on the connecting longitudinal section 112. Being driven by the pressing member 12, the transmission member 13 can slide against the connecting longitudinal section 112. In this embodiment, two connecting longitudinal sections 112 are disposed and are connected to two ends of the handheld horizontal section 111 and a front end of the shell 19; and one transmission member 13 is disposed, which is located on one of the connecting longitudinal sections 112 and penetrates the front end of the shell 19 in a sliding manner. A through hole 191 is opened on a side wall of the shell 19, and the bolt 141 penetrates through the through hole 191. Stretching and retracting directions of the bolt 141 may be perpendicular to a sliding direction of the transmission member 13.

Figure 4:
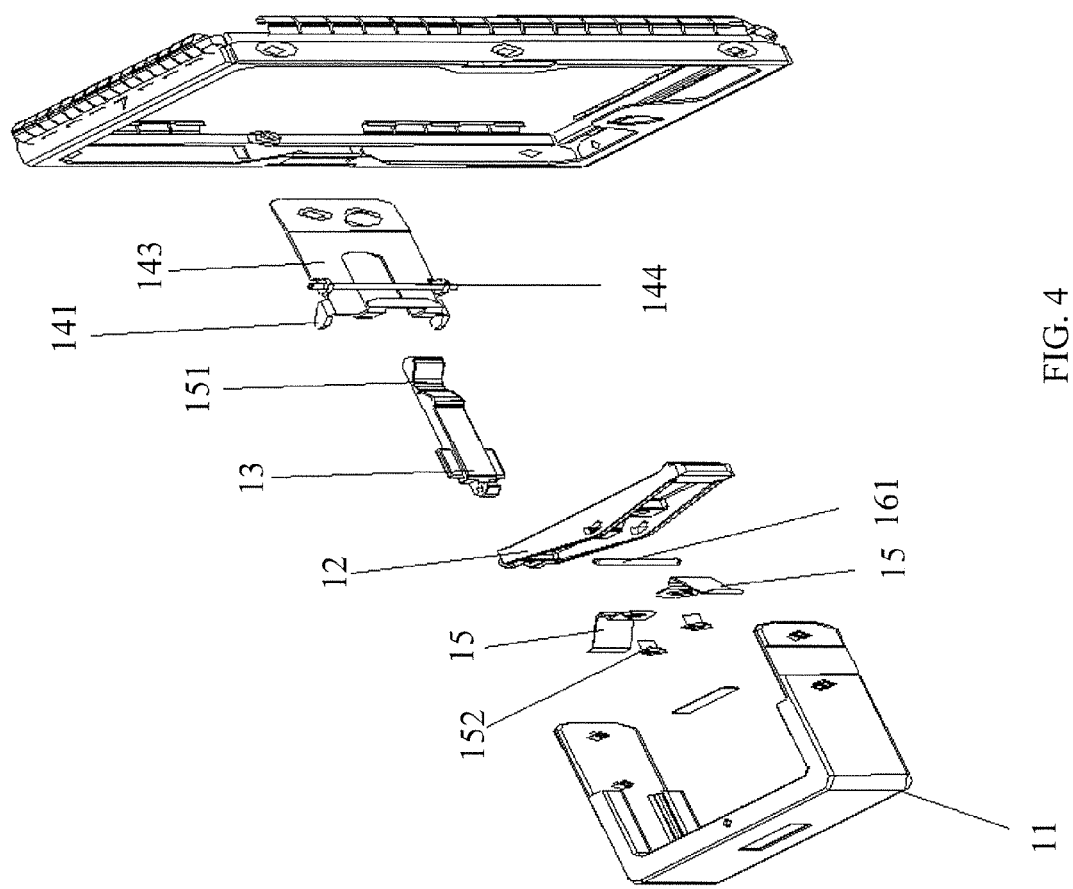
FIG. 4 is a stereogram of decomposition of a handle locking structure according to Embodiment 1 of the present invention.

Specifically, as shown in FIG. 2 to FIG. 4, the unlocking structure may include a shovel block 151 and a locking member 143. The locking member 143 is disposed on a side wall of the shell 19 in a sliding manner, and a sliding direction of the locking member 143 is perpendicular to the sliding direction of the transmission member 13; the shovel block 151 is connected to the transmission member 13 in a fixed manner or is integrally formed on the transmission member 13, and the bolt 141 is connected to the locking member 143 in a fixed manner or is integrally formed on the locking member 143; and the shovel block 151 has an arc surface or a slope, and the locking member 143 contacts the arc surface or the slope of the shovel block 151 in a sliding manner. When the shovel block 151 slides in a direction that is close to the locking member 143 or a direction that is far away from the locking member 143, the locking member 143 can also slide against the shell 19 under the action of the arc surface or the slope of the shovel block 151, so that the bolt 141 can stretch out of the through hole 191 of the shell 19 or retract into the through hole 191. It may be understood that, the shovel block 151 may be presented in a block shape or may be presented in a frame shape, and may specifically be formed by bending metal.

Specifically, as shown in FIG. 2 to FIG. 4, a middle section of the pressing member 12 is connected to a middle section of the handle body 11 by means of rotation of a pin shaft 161. The pressing member 12 may be presented in a stripe shape. Two stainless steel elastic sheets 15 may be disposed between the pressing member 12 and the handle body 11, and the two stainless steel elastic sheets 15 each are fixed, by using a locking part 152, on an end surface of the pressing member 12, where the end surface of the pressing member 12 is opposite to the handle body 11. The locking part 152 may be a screw, and the two stainless steel elastic sheets 15 are separately disposed on two sides of the pin shaft 161. Under a restoring action of the stainless steel elastic sheets 15, the pressing member 12 can restore in time. One end of the pressing member 12 is connected to an end part of the transmission member 13 by means of rotation of the pin shaft. In this way, both ends of the pressing member 12 can be pressed down, and correspondingly, the pressing member 12 can drive the transmission member 13 to slide in a forward direction or a backward direction. As shown in FIG. 3, the transmission member 13 slides outward when the left of the pressing member 12 is pressed; and the transmission member 13 slides inward when the right of the pressing member 12 is pressed. Two arc surfaces or slopes are disposed on the shovel block 151, and the two arc surfaces or slopes are disposed oppositely. A transmission shaft 144 that can contact the arc surfaces or the slopes is disposed on the locking member 143 in a fixed manner. In this embodiment, two slopes are disposed on the shovel block 151. The two slopes are presented in a "V" shape and transition between the two slopes is smooth. The locking member 143 may be a metal elastic sheet, and its end is fixed on an inner side of the shell 19 in a manner of locking by the locking part, soldering, or riveting. The bolt 141 may be disposed on the metal elastic sheet in a fixed manner and stretches out of the through hole 191 on the shell 19. The transmission shaft 144 may be connected to the metal elastic sheet in a fixed manner. Friction between the transmission shaft 144 and the shovel block 151 is small, so that sliding of the locking member 143 is smoother. In a normal condition, the transmission shaft 144 is located on a valley bottom between the two slopes. In this way, no matter the operator presses one end of the pressing member 12 or the other end of the pressing member 12, both the transmission member 13 and the shovel block 151 can slide in a forward direction or a backward direction correspondingly, and the transmission shaft 144 can enable the bolt 141 to retract into the shell 19 under the driving of the slopes. A bidirectional unlocking function is implemented, and operation habits of different operators can be met. Moreover, even the subrack is over-turned 180 degrees, the operation habits are not affected. Definitely, a shape of the shovel block 151 may also be designed as a triangle shape, and two transmission shafts 144 may be disposed, and may be disposed separately on two sides of the shovel block 151. When the operator presses any end of the pressing member 12, the bolt 141 can also be enabled to retract.

Figure 5:
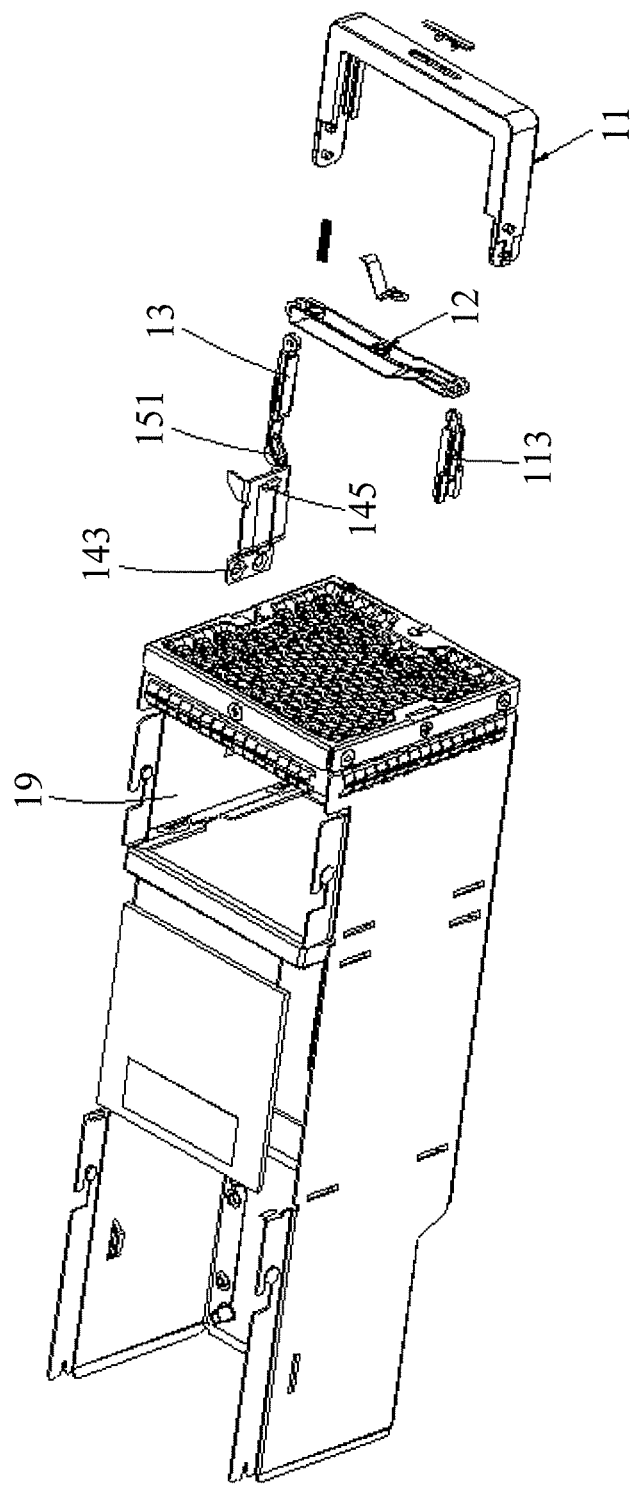
FIG. 5 is a stereogram of decomposition of a handle locking structure in which a pressing member can rotate unidirectionally according to Embodiment 1 of the present invention.
Figure 6:
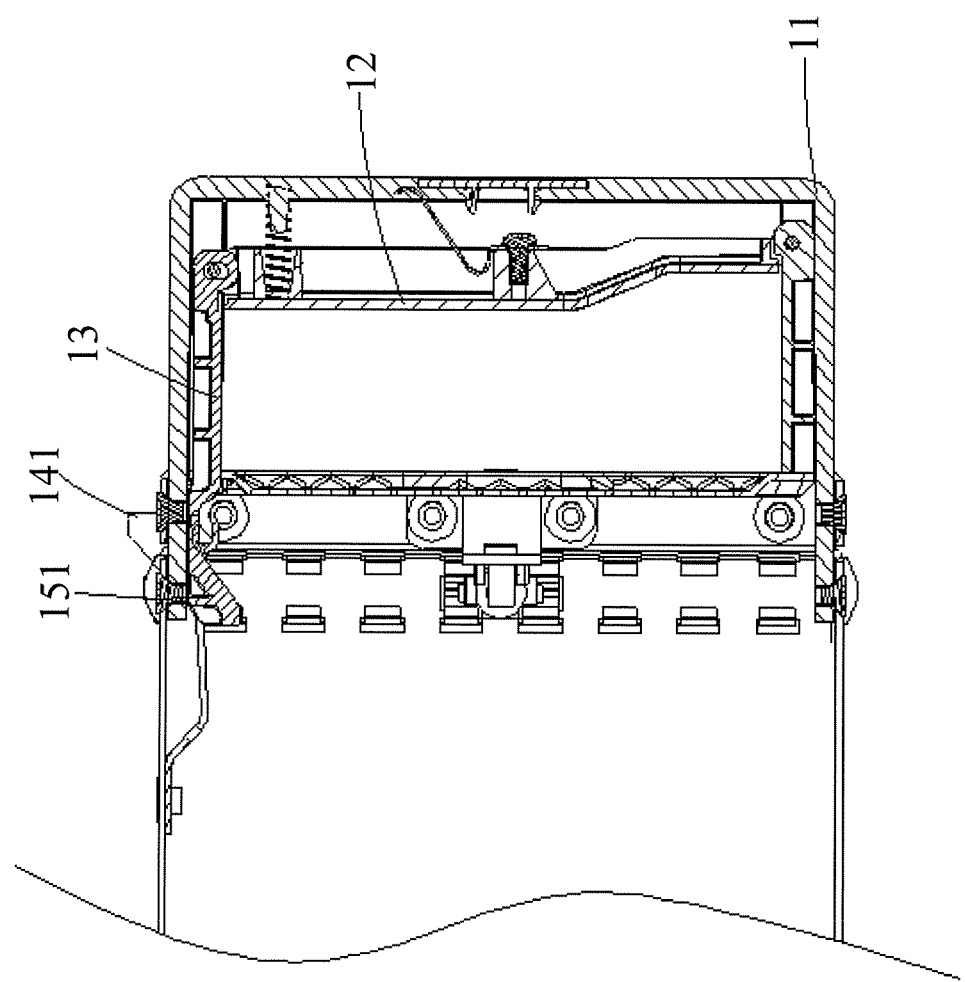
FIG. 6 is a sectional diagram of a handle locking structure in which a pressing member can rotate unidirectionally according to Embodiment 1 of the present invention.

Alternatively, as shown in FIG. 5 and FIG. 6, a handle locking structure in which a pressing member 12 can rotate unidirectionally is provided. One end of the pressing member 12 in the handle locking structure is connected to a handle body 11 or is connected to a connecting base 113 by means of rotation of a pin shaft, where the connecting base 113 may be connected to the handle body 11 in a fixed manner; and the other end of the pressing member 12 is connected to a transmission member 13 by means of rotation of a pin shaft. A shovel block 151 may be presented in a wedge shape. A locking member 143 is an elastic sheet, and one end of the elastic sheet is connected to an inner side wall of a shell 19 in a fixed manner. A bolt 141 is disposed on the elastic sheet in a fixed manner and stretches out of a through hole 191 of the shell 19, and a force-bearing part 145 that can contact an arc surface or a slope of the shovel block 151 is disposed on the elastic plate. In this way, an operator can only press the other end of the pressing member 12 to enable the transmission member 13 and the shovel block 151 to slide in a direction of the pressing member 12, and the force-bearing part 145 enables the bolt 141 to retract into the shell 19 under the action of the wedge-shape shovel block 151, so as to implement unlocking. Definitely, it may be understood that, a shape of the shovel block 151 may also be designed as another shape with an arc surface or a slope, and a shape of the locking member 143 may also be disposed as another proper shape, which all fall within the protection scope of the present invention.

Specifically, the foregoing locking member 143 may be disposed in a left-and-right sliding manner, and the transmission member 13 may be disposed in a horizontal sliding manner.

It may be understood that, for location terms described in this embodiment, such as front end, outer side, and inner side, reference is made to a routine operating state of a product, which should not be considered as restrictive.

This embodiment of the present invention further provides an electronic device, where the electronic device may be a communications device, a server, or the like. The foregoing electronic device includes a rack, and a subrack that can be pulled out of the rack is disposed on the rack. The subrack includes a shell 19, and an electronic component may be disposed inside the shell 19. The foregoing handle locking structure is disposed on the subrack, and a lock hole used by a bolt 141 for snapping is opened on the rack. Through such design, when pulling the subrack out of the rack by using a handle body 11, an operator can enable, by pressing a pressing member 12 on the handle body 11 through the foregoing transmission member 13 and the unlocking structure, the bolt 141 on a locking member 143 to exit from the lock hole. The operation is quite convenient and is beneficial for improving an operation comfort degree. The appearance of the subrack is elegant.

According to the handle locking structure and the electronic device that are provided in this embodiment of the present invention, a pressing member 12 is disposed on a handle body 11, so that an operator can press the pressing member 12 to drive a transmission member 13, and enables, through an unlocking structure, a bolt 141 to retract. An unlocking operation is simple and can be performed with one hand. An operation comfort degree is high and operation feel is good, which is beneficial for improving product quality.

Embodiment 2

A handle locking structure provided in this embodiment of the present invention can be applied to an electronic device, such as a server and a communications device. The electronic device may include a rack and a subrack, where the subrack is disposed on the rack.

Figure 7:
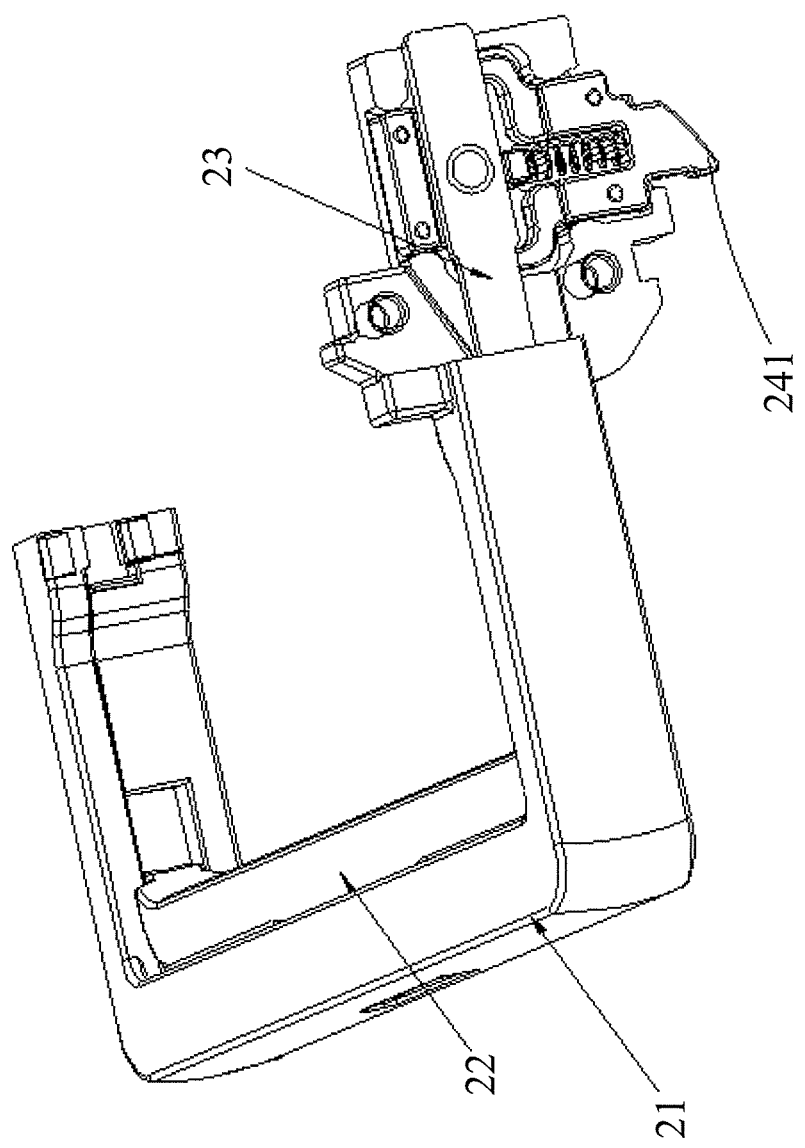
FIG. 7 is an assembly stereogram of a handle locking structure according to Embodiment 2 of the present invention.
Figure 8:
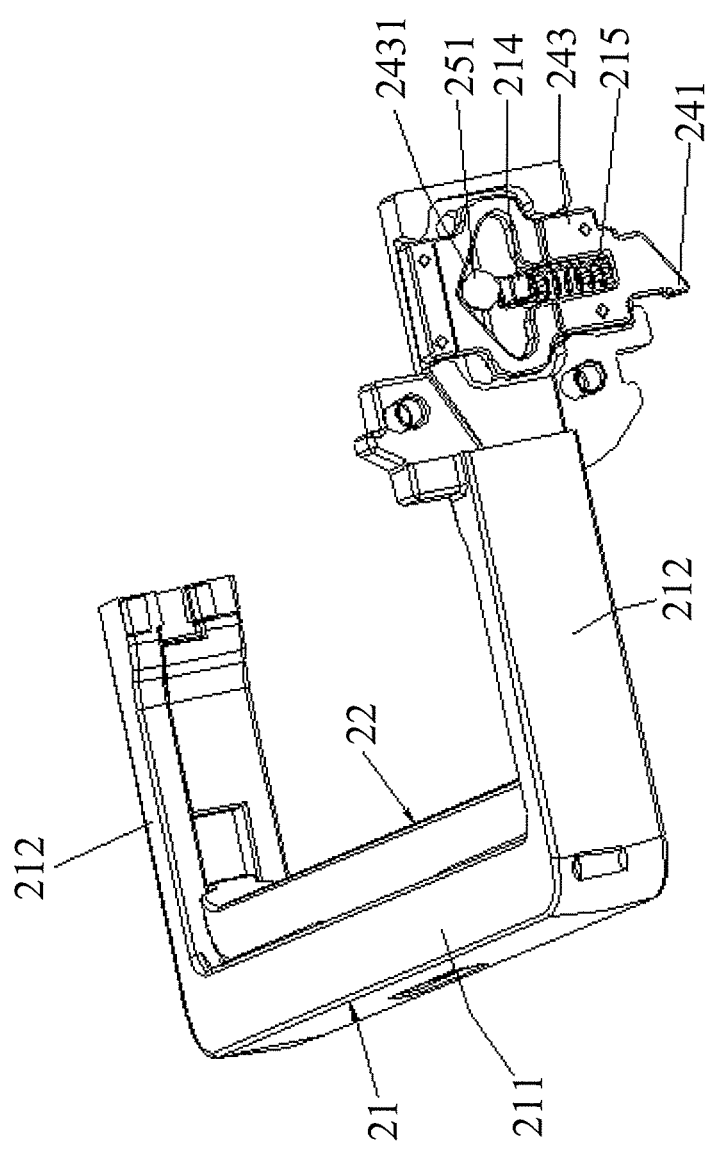
FIG. 8 is an assembly stereogram of a handle locking structure from which a transmission member is removed according to Embodiment 2 of the present invention.

As shown in FIG. 7 and FIG. 8, the foregoing handle locking structure includes a handle body 21, a pressing member 22, a transmission member 23 that is connected to the pressing member 22, and a locking part that can be driven by the transmission member 23.

As shown in FIG. 7 and FIG. 8, the handle body 21 may be connected to a shell of the subrack. An operator can hold the handle body 21, so as to insert the subrack into the rack or pull the subrack out of the rack. The pressing member 22 is connected to the handle body 21 in a sliding or rotating manner. The operator can press the pressing member 22 when holding the handle body 21. The operation can be performed with one hand and therefore the operation is easy and convenient. The transmission member 23 may be driven by the pressing member 22 and can slide against the shell. The transmission member 23 may be presented in a pole shape and the transmission member 23 is disposed between the pressing member 22 and the locking part. In a specific application, the pressing member 22 may be connected to the handle body 21 in a rotating manner. Specifically, the pressing member 22 may be connected to the handle body 21 by means of rotation of a pin shaft. One end of the transmission member 23 may be connected to one end of the pressing member 22 by means of rotation of the pin shaft. When the pressing member 22 is pressed or released, the transmission member 23 can slide in a direction that is close to the locking part or a direction that is far away from the locking part, so that the locking part is in an unlocking or locking state.

Figure 9:
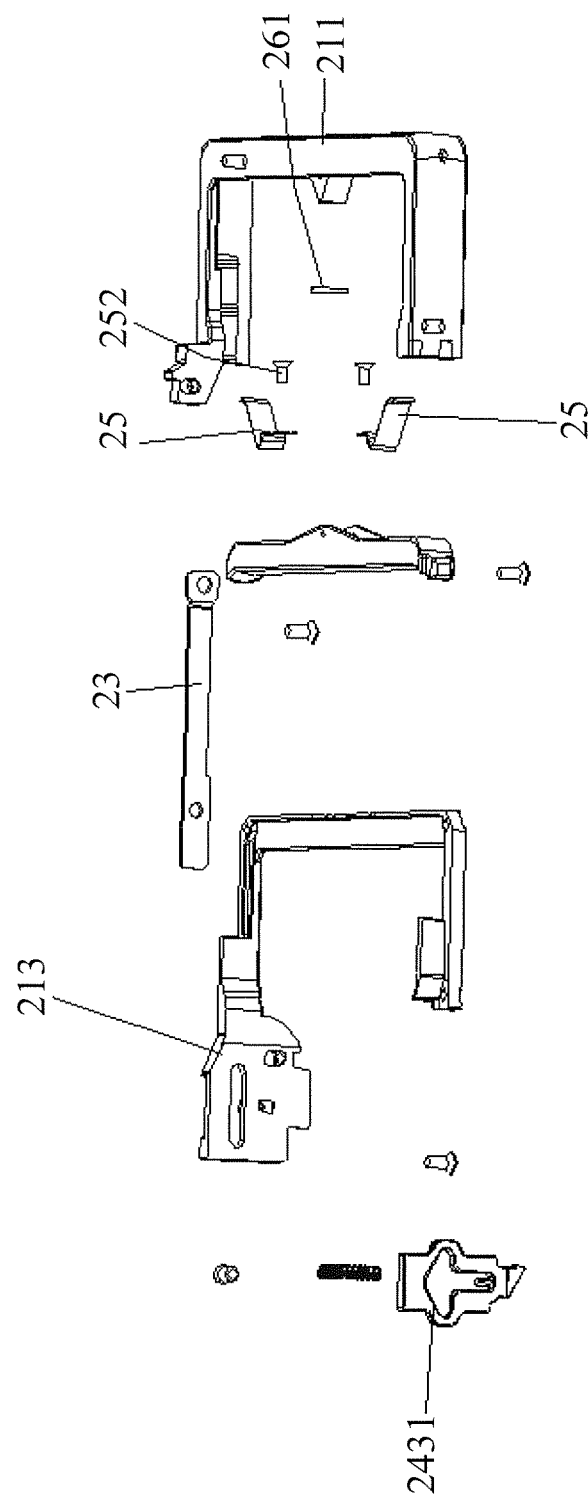
FIG. 9 is a stereogram of decomposition of a handle locking structure according to Embodiment 2 of the present invention.

As shown in FIG. 8 and FIG. 9, the locking part includes a bolt 241 that elastically stretches out of an outer peripheral wall of the shell. Specifically, a through hole is opened on a side wall of the shell and the bolt 241 stretches from the through hole. Correspondingly, a lock hole cooperating with the bolt 241 is opened on the rack.

Specifically, as shown in FIG. 9, one end of the transmission member 23 is connected to the pressing member 22, and an unlocking structure that is used to enable the bolt 241 to retract is disposed between the other end of the transmission member 23 and the locking part.

The transmission member 23 is connected to the bolt 241 through the unlocking structure. The operator can enable the transmission member 23 to slide by pressing the pressing member 22, and the sliding transmission member 23 functions on the bolt 241 through the unlocking structure to enable the bolt 241 to retract.

In a normal condition, the bolt 241 can snap into the lock hole, and the subrack may be kept in a locking state. If the subrack needs to be pulled out of the rack, the operator only needs to hold the handle body 21 and press the pressing member 22. The pressing member 22 enables the transmission member 23 to slide, and the sliding transmission member 23 enables, through the unlocking structure, the bolt 241 to retract, so that the bolt 241 can exit from the lock hole and the operator can pull out the subrack by using the handle body 21 again.

Further, as shown in FIG. 8 and FIG. 9, an elastic restoring part 25 is disposed between the pressing member 22 and the handle body 21. When the operator presses the pressing member 22, the elastic restoring part 25 is elastically compressed, and the pressing member 22 enables, through the transmission member 23, the bolt 241 to exit from the lock hole. The bolt 241 is in an unlocking state, and the subrack can be pulled out of the rack. After the operator's hand leaves the handle body 21 or releases the pressing member 22, the pressing member 22 can restore to an original position in time under the action of the elastic restoring part 25, and the bolt 241 can stretch out of the outer peripheral wall of the shell again, so that the bolt 241 is reliably kept in a locking state. Because the elastic restoring part 25 is disposed between the pressing member 22 and the handle body 21, it is also easy for the operator to sense whether the pressing member 22 is pressed properly or restores in time. Operation feel is good. The operator can accurately sense whether the bolt 241 is in a locking state or an unlocking state. The elastic restoring part 25 may be a stainless steel elastic sheet, a spring, or the like. It may be understood that, one, two, or multiple elastic restoring parts 25 may be disposed.

In a specific application, the disposing of the elastic restoring part 25 may be canceled, and the pressing member 22 may restore by depending on elasticity of the bolt 241, which also falls within the protection scope of the present invention.

Specifically, as shown in FIG. 8 and FIG. 9, the handle body 21 includes a handheld horizontal section 211 and a connecting longitudinal section 212 that connects the handheld horizontal section 211 and the shell, and the handheld horizontal section 211 and the connecting longitudinal section 212 can be integrally formed. The handheld horizontal section 211 and the shell are disposed oppositely. An assembly slot is opened on one side of the handheld horizontal section 211, where the side of the handheld horizontal section 211 is opposite to the shell, and the pressing member 22 is disposed in the assembly slot, which is equivalent to that the pressing member 22 is disposed in an inner side of the handle body 21. Therefore, the pressing member 22 is not easy to be pressed by mistake, and reliability is high.

Specifically, as shown in FIG. 8 and FIG. 9, the pressing member 22 protrudes out of the assembly slot, and the operator can press the pressing member 22 conveniently; and the transmission member 23 is disposed along the connecting longitudinal section 212 and stretches into the shell, and the transmission member 23 can slide against the connecting longitudinal section 212 under the driving of the pressing member 22. In this embodiment, two connecting longitudinal sections 212 are disposed and are connected to two ends of the handheld horizontal section 211 and a front end of the shell; one transmission member 23 is disposed, which is located on one of the connecting longitudinal sections 212 and penetrates the front end of the shell in a sliding manner. A through hole is opened on a side wall of the shell, and the bolt 241 penetrates through the through hole. Stretching and retracting directions of the bolt 241 may be perpendicular to a sliding direction of the transmission member 23.

Specifically, as shown in FIG. 8 and FIG. 9, the unlocking structure may include a locking member 243 and a driving shaft 251, where the locking member 243 is disposed on a side wall of the shell in a sliding manner. Specifically, a holder 213 may be disposed on the handle body 21 or the shell, the locking member 243 may be disposed on the holder 213 in a sliding manner, and the bolt 241 at the front end of the locking member 243 may stretch out of the shell. A limiting block 214 is disposed on the holder 213 in a fixed manner, and an elastic part 215 is disposed between the locking member 243 and the limiting block 214. The elastic part 215 may be a spring or the like, so that the bolt 241 may be kept stretching out of the through hole of the shell in a normal condition. A sliding direction of the locking member 243 is perpendicular to the sliding direction of the transmission member 23; the driving shaft 251 is connected to the transmission member 23 in a fixed manner or is integrally formed on the transmission member 23, and the bolt 241 is connected to the locking part 243 in a fixed manner or is integrally formed on the locking member 243; and an arc surface or a slope is disposed on the locking member 243, and the driving shaft 251 contacts the arc surface or the slope of the locking member 243 in a sliding manner. When the transmission member 23 slides, the driving shaft 251 can contact the arc surface or the slope of the locking member 243 and enables the locking member 243 to slide, so that the bolt 241 can stretch out of the through hole or retract into the through hole.

Specifically, as shown in FIG. 8 and FIG. 9, a middle section of the pressing member 22 is connected to the handle body 21 by means of rotation of a pin shaft 261. The pressing member 22 may be presented in a stripe shape. Two stainless steel elastic sheets 25 are disposed between the pressing member 22 and the handle body 21, and the two stainless steel elastic sheets 25 are fixed, by using a locking part 252, on an end surface of the pressing member 22, where the end surface of the pressing member 22 is opposite to the handle body 21. The locking part 252 may be a screw, and the two stainless steel elastic sheets 25 are separately disposed on two sides of the pin shaft 261. Under a restoring action of the stainless steel elastic sheets 25, the pressing member 22 can restore in time. One end of the pressing member 22 is connected to an end part of the transmission member 23 by means of rotation of the pin shaft. In this way, both ends of the pressing member 22 can be pressed down, and correspondingly, the pressing member 22 can drive the transmission member 23 and the driving shaft 251 to slide in a forward direction or a backward direction. A driving hole 2431 is opened on the locking member 243. The driving hole 2431 has a slope that is disposed against the sliding direction of the transmission member 23 in an inclining manner. Two slopes are disposed and the two slopes are disposed oppositely. The driving shaft 251 contacts the slopes. The driving hole 2431 may be presented in a triangle shape. In a normal condition, the driving shaft 251 is located on a top corner of a triangle. In this way, no matter the operator presses one end of the pressing member 22 or the other end of the pressing member 22, both the transmission member 23 and the driving shaft 251 can slide in a forward direction or a backward direction correspondingly, and are driven to slide to a left end or a right end of the triangular driving hole 2431, and the locking member 243 can rise under the driving of the slopes to enable the bolt 241 to retract into the shell. A bidirectional unlocking function is implemented, and operation habits of different operators can be met. Moreover, even the subrack is overturned 180 degrees, an operation habits are not affected.

Figure 10:
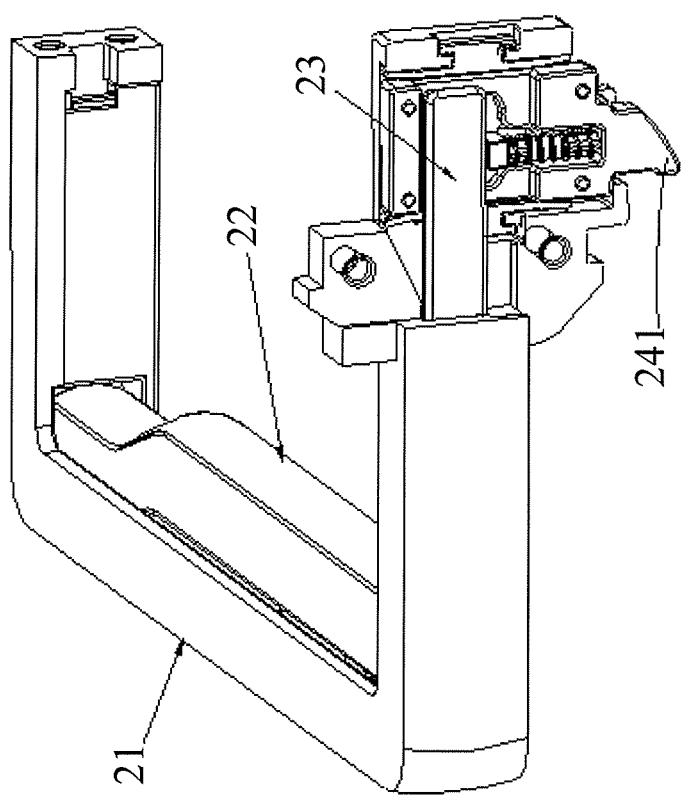
FIG. 10 is an assembly stereogram of a handle locking structure in which a pressing member can rotate unidirectionally according to Embodiment 2 of the present invention.
Figure 11:
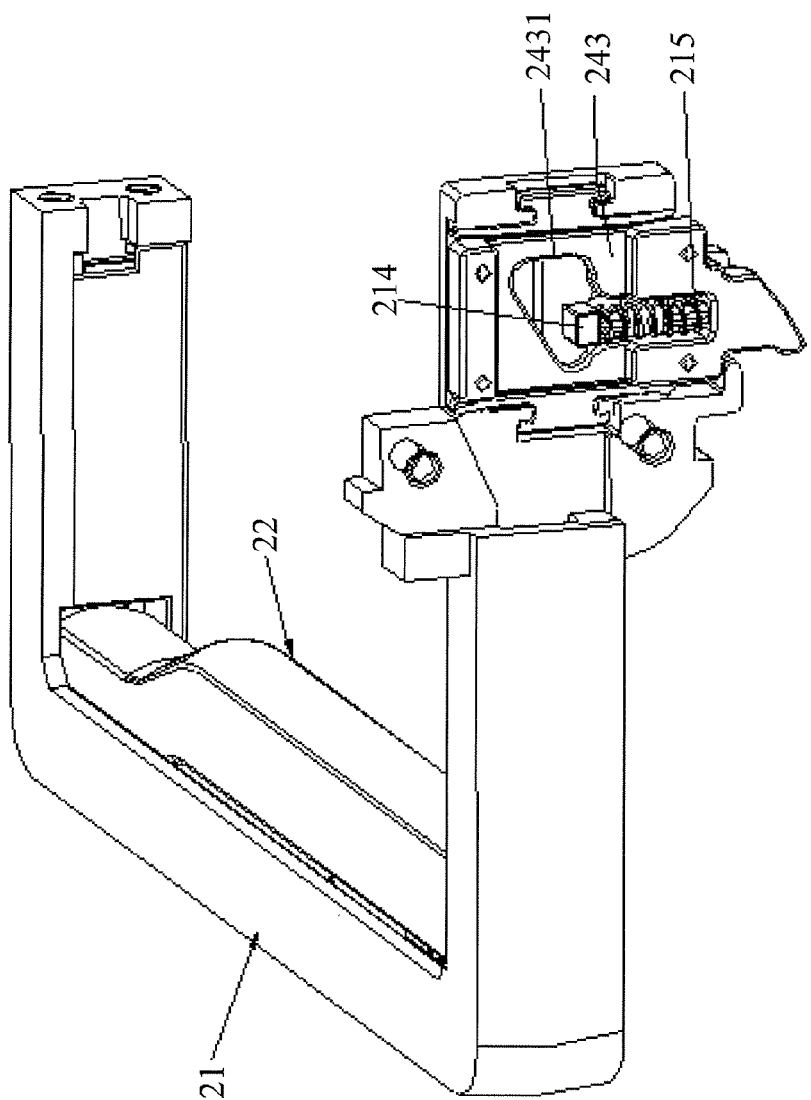
FIG. 11 is an assembly stereogram of a handle locking structure in which a pressing member can rotate unidirectionally and from which a transmission member is removed according to Embodiment 2 of the present invention.
Figure 12:
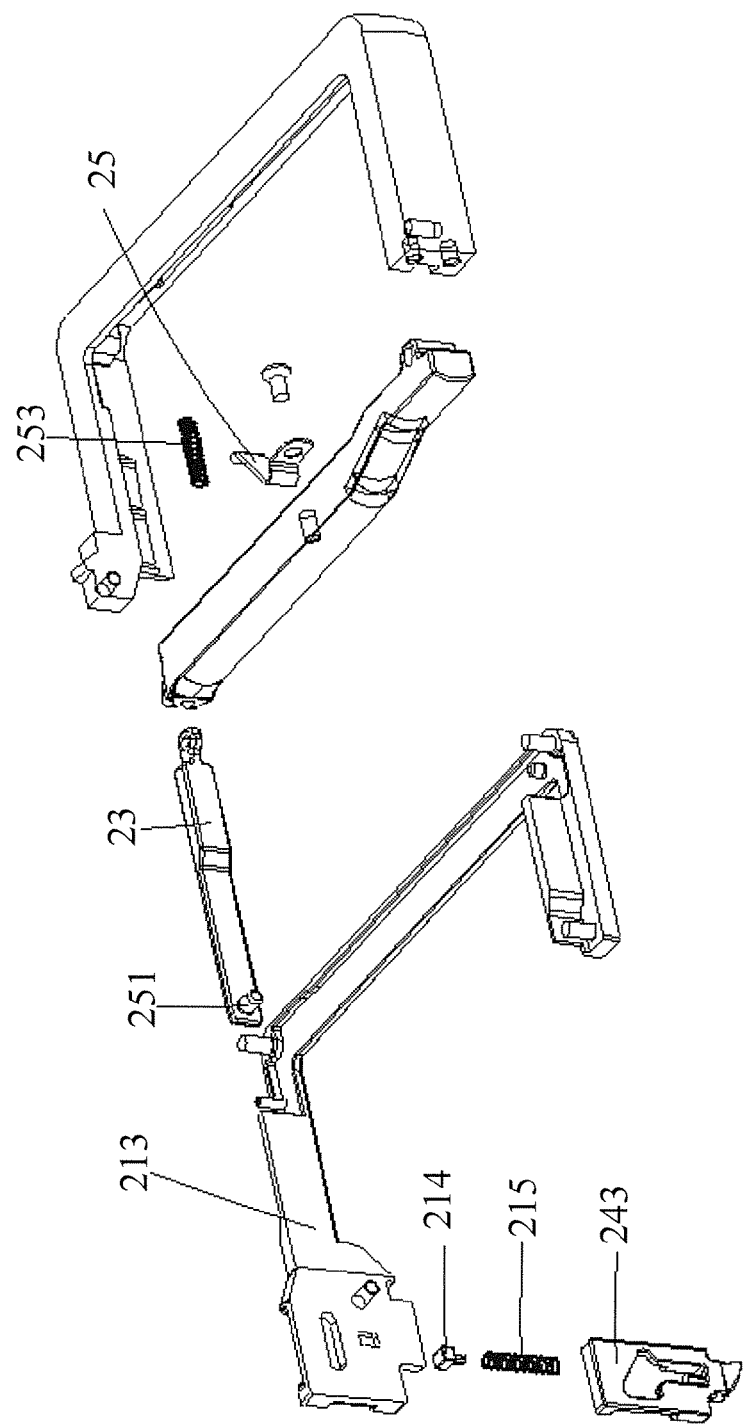
FIG. 12 is a stereogram of decomposition of a handle locking structure in which a pressing member can rotate unidirectionally according to Embodiment 2 of the present invention.

Alternatively, as shown in FIG. 10 to FIG. 12, a handle locking structure in which a pressing member 22 can rotate unidirectionally is provided. One end of the pressing member 22 in the handle locking structure is connected to a handle body 21 by means of rotation, and the other end of a locking member 243 is connected to a transmission member 23 by means of rotation. A stainless steel elastic sheet 25 is disposed between a middle section of the pressing member 22 and the handle body 21, and a spring 253 is further disposed between one end of the pressing member 22 and the handle body 21, where the end of the pressing member 22 is close to the transmission member 23. A restoring effect is better. A driving hole 2431 is opened on the locking member 243. The driving hole 2431 has a slope that is disposed against a sliding direction of the transmission member 23 in an inclining manner. The driving shaft 251 contacts the slope. In this way, an operator can only press the other end of the pressing member 22 to enable the transmission member 23 and the driving shaft 251 to slide in a direction of the pressing member 22, and the driving shaft 251 can enable, by using a slope on the locking member 243, the bolt 241 to retract into a through hole of a shell.

Specifically, the foregoing locking member 243 may be disposed in an up-and-down sliding manner, and the transmission member 23 may be disposed in a horizontal sliding manner.

It may be understood that, for location terms described in this embodiment, such as front end, outer side, and inner side, reference is made to a routine operating state of a product, which should not be considered as restrictive.

This embodiment of the present invention further provides an electronic device, where the electronic device may be a communications device, a server, or the like. The foregoing electronic device includes a rack, and a subrack that can be pulled out of the rack is disposed on the rack. The subrack includes a shell, and an electronic component is disposed inside the shell. The foregoing handle locking structure is disposed on the subrack, and a lock hole used by a bolt 241 for snapping is opened on the rack. Through such design, when pulling the subrack out of the rack by using a handle body 21, an operator can enable, by pressing a pressing member 22 on the handle body 21 through the foregoing transmission member 23 and the unlocking structure, the bolt 241 on a locking member 243 to exit from the lock hole. An operation is quite convenient, which is beneficial for improving an operation comfort degree.

According to the handle locking structure and the electronic device that are provided in this embodiment of the present invention, a pressing member 22 is disposed on a handle body 21, so that an operator can press the pressing member 22 to drive a transmission member 23, and enables, through an unlocking structure, a bolt 241 to retract. An unlocking operation is simple and can be performed with one hand. An operation comfort degree is high and operation feel is good, which is beneficial for improving product quality.

The foregoing descriptions are merely exemplary embodiments of the present invention, but are not intended to limit the present invention. Any modifications, equivalent replacements, and improvements made within the spirit and principle of the present invention shall all fall within the protection scope of the present invention.

What is claimed is:

1. A handle locking structure, comprising:
   a handle body connected to a shell;
   a pressing member connected to the handle body in a sliding or rotating manner; and
   a transmission member and a locking part that can slide against the shell, wherein the locking part comprises a bolt that elastically stretches out of an outer peripheral wall of the shell, the transmission member is connected to the pressing member, an unlocking structure that is used to enable the bolt to retract is disposed between the transmission member and the locking part, the transmission member is connected to the bolt through the unlocking structure, the transmission member can slide by pressing the pressing member, and the sliding transmission member functions on the bolt through the unlocking structure to enable the bolt to retract; wherein:

the unlocking structure comprises a shovel block and a locking member;

the shovel block is connected to the transmission member in a fixed manner or is integrally formed on the transmission member, and the bolt is connected to the locking member in a fixed manner or is integrally formed on the locking member; and the shovel block has an arc surface or a slope, and the locking member contacts the arc surface or the slope of the shovel block in a sliding manner; wherein:

a middle section of the pressing member is connected to the handle body in a rotating manner; one end of the pressing member is connected to the transmission member in a rotating manner; and two arc surfaces or slopes are disposed on the shovel block, the two arc surfaces or slopes are disposed oppositely, and a transmission shaft that can contact the slopes is disposed on the locking member in a fixed manner.

2. The handle locking structure according to claim 1, wherein an elastic restoring part is disposed between the pressing member and the handle body.

3. The handle locking structure according to claim 1, wherein:

the handle body comprises a horizontal section that is disposed against the shell and a connecting longitudinal section that connects the horizontal section and the shell;

an assembly slot is opened on one side of the horizontal section, wherein the side of the handheld horizontal section is opposite to the shell; and the pressing member is disposed in the assembly slot.

4. A handle locking structure, comprising:

a handle body connected to a shell;

a pressing member connected to the handle body in a sliding or rotating manner; and a transmission member and a locking part that can slide against the shell, wherein the locking part comprises a bolt that elastically stretches out of an outer peripheral wall of the shell, the transmission member is connected to the pressing member, an unlocking structure that is used to enable the bolt to retract is disposed between the transmission member and the locking part, the transmission member is connected to the bolt through the unlocking structure, the transmission member can slide by pressing the pressing member, and the sliding transmission member functions on the bolt through the unlocking structure to enable the bolt to retract; wherein:

the unlocking structure comprises a shovel block and a locking member;

the shovel block is connected to the transmission member in a fixed manner or is integrally formed on the transmission member, and the bolt is connected to the locking member in a fixed manner or is integrally formed on the locking member; and the shovel block has an arc surface or a slope, and the locking member contacts the arc surface or the slope of the shovel block in a sliding manner; wherein:

one end of the pressing member is connected to the handle body in a rotating manner, and the other end of the pressing member is connected to the transmission member in a rotating manner; and the shovel block is presented in a wedge shape, the locking member is an elastic sheet, one end of the elastic sheet is connected to an inner side wall of the shell, the bolt is disposed on the other end of the elastic sheet in a fixed manner, and a force-bearing part that can contact the arc surface or the slope of the shovel block is disposed on the elastic sheet.

5. A handle locking structure, comprising:

a handle body connected to a shell;

a pressing member connected to the handle body in a sliding or rotating manner; and a transmission member and a locking part that can slide against the shell, wherein the locking part comprises a bolt that elastically stretches out of an outer peripheral wall of the shell, the transmission member is connected to the pressing member, an unlocking structure that is used to enable the bolt to retract is disposed between the transmission member and the locking part, the transmission member is connected to the bolt through the unlocking structure, the transmission member can slide by pressing the pressing member, and the sliding transmission member functions on the bolt through the unlocking structure to enable the bolt to retract; wherein:

the unlocking structure comprises a locking member and a driving shaft, the driving shaft is connected to the transmission member in a fixed manner or is integrally formed on the transmission member, and the bolt is connected to the locking member in a fixed manner or is integrally formed on the locking member; and an arc surface or a slope is disposed on the locking member, and the driving shaft contacts the arc surface or the slope of the locking member in a sliding manner;

wherein:

a middle section of the pressing member is connected to the handle body in a rotating manner, and one end of the pressing member is connected to the transmission member in a rotating manner; and a driving hole is opened on the locking member, the driving hole has a slope that is disposed against a sliding direction of the transmission member in an inclining manner, two slopes are disposed, the two slopes are disposed oppositely, and the driving shaft contacts the slopes.

6. A handle locking structure, comprising:

a handle body connected to a shell;

a pressing member connected to the handle body in a sliding or rotating manner; and a transmission member and a locking part that can slide against the shell, wherein the locking part comprises a bolt that elastically stretches out of an outer peripheral wall of the shell, the transmission member is connected to the pressing member, an unlocking structure that is used to enable the bolt to retract is disposed between the transmission member and the locking part, the transmission member is connected to the bolt through the unlocking structure, the transmission member can slide by pressing the pressing member, and the sliding transmission member functions on the bolt through the unlocking structure to enable the bolt to retract; wherein:

the unlocking structure comprises a locking member and a driving shaft, the driving shaft is connected to the transmission member in a fixed manner or is integrally formed on the transmission member, and the bolt is connected to the locking member in a fixed manner or is integrally formed on the locking member; and an arc surface or a slope is disposed on the locking member, and the driving shaft contacts the arc surface or the slope of the locking member in a sliding manner;

wherein:

one end of the pressing member is connected to the handle body in a rotating manner, and the other end of the locking member is connected to the transmission member in a rotating manner; and a driving hole is opened on the locking member, the driving hole has a slope that is disposed against a sliding direction of the transmission member in an inclining manner, and the driving shaft contacts the slopes.

7. An electronic device, comprising:

a rack, wherein a subrack that can be pulled out of the rack is disposed on the rack, a handle locking structure is disposed on the subrack, and a lock hole that is used by a bolt for snapping is opened on the rack, wherein the handle locking structure comprises:

a handle body connected to a shell, a pressing member that is connected to the handle body in a sliding or rotating manner, and a transmission member and a locking part that can slide against the shell, wherein the locking part comprises a bolt that elastically stretches out of an outer peripheral wall of the shell, the transmission member is connected to the pressing member, an unlocking structure that is used to enable the bolt to retract is disposed between the transmission member and the locking part, the transmission member is connected to the bolt through the unlocking structure, the transmission member can slide by pressing the pressing member, and the sliding transmission member functions on the bolt through the unlocking structure to enable the bolt to retract; wherein:

the unlocking structure comprises a shovel block and a locking member;

the shovel block is connected to the transmission member in a fixed manner or is integrally formed on the transmission member, and the bolt is connected to the locking member in a fixed manner or is integrally formed on the locking member; and the shovel block has an arc surface or a slope, and the locking member contacts the arc surface or the slope of the shovel block in a sliding manner; wherein:

a middle section of the pressing member is connected to the handle body in a rotating manner;

one end of the pressing member is connected to the transmission member in a rotating manner; and two arc surfaces or slopes are disposed on the shovel block, the two arc surfaces or slopes are disposed oppositely, and a transmission shaft that can contact the slopes is disposed on the locking member in a fixed manner.

8. The electronic device according to claim 7, wherein an elastic restoring part is disposed between the pressing member and the handle body.

9. The electronic device according to claim 7, wherein:

the handle body comprises a horizontal section that is disposed against the shell and a connecting longitudinal section that connects the horizontal section and the shell;

an assembly slot is opened on one side of the horizontal section, wherein the side of the horizontal section is opposite to the shell; and the pressing member is disposed in the assembly slot.

10. An electronic device, comprising:

a rack, wherein a subrack that can be pulled out of the rack is disposed on the rack, a handle locking structure is disposed on the subrack, and a lock hole that is used by a bolt for snapping is opened on the rack, wherein the handle locking structure comprises:

a handle body connected to a shell, a pressing member that is connected to the handle body in a sliding or rotating manner, and a transmission member and a locking part that can slide against the shell, wherein the locking part comprises a bolt that elastically stretches out of an outer peripheral wall of the shell, the transmission member is connected to the pressing member, an unlocking structure that is used to enable the bolt to retract is disposed between the transmission member and the locking part, the transmission member is connected to the bolt through the unlocking structure, the transmission member can slide by pressing the pressing member, and the sliding transmission member functions on the bolt through the unlocking structure to enable the bolt to retract;

wherein:

the unlocking structure comprises a shovel block and a locking member;

the shovel block is connected to the transmission member in a fixed manner or is integrally formed on the transmission member, and the bolt is connected to the locking member in a fixed manner or is integrally formed on the locking member; and the shovel block has an arc surface or a slope, and the locking member contacts the arc surface or the slope of the shovel block in a sliding manner;

wherein:

one end of the pressing member is connected to the handle body in a rotating manner, and the other end of the pressing member is connected to the transmission member in a rotating manner; and the shovel block is presented in a wedge shape, the locking member is an elastic sheet, one end of the elastic sheet is connected to an inner side wall of the shell, the bolt is disposed on the other end of the elastic sheet in a fixed manner, and a force-bearing part that can contact the arc surface or the slope of the shovel block is disposed on the elastic sheet.

11. An electronic device, comprising:

a rack, wherein a subrack that can be pulled out of the rack is disposed on the rack, a handle locking structure is disposed on the subrack, and a lock hole that is used by a bolt for snapping is opened on the rack, wherein the handle locking structure comprises:

a handle body connected to a shell, a pressing member that is connected to the handle body in a sliding or rotating manner, and a transmission member and a locking part that can slide against the shell, wherein the locking part comprises a bolt that elastically stretches out of an outer peripheral wall of the shell, the transmission member is connected to the pressing member, an unlocking structure that is used to enable the bolt to retract is disposed between the transmission member and the locking part, the transmission member is connected to the bolt through the unlocking structure, the transmission member can slide by pressing the pressing member, and the sliding transmission member functions on the bolt through the unlocking structure to enable the bolt to retract; wherein:
the unlocking structure comprises a locking member and a driving shaft, the driving shaft is connected to the transmission member in a fixed manner or is integrally formed on the transmission member, and the bolt is connected to the locking member in a fixed manner or is integrally formed on the locking member; and
an arc surface or a slope is disposed on the locking member, and the driving shaft contacts the arc surface or the slope of the locking member in a sliding manner;

wherein:
a middle section of the pressing member is connected to the handle body in a rotating manner, and one end of the pressing member is connected to the transmission member in a rotating manner; and
a driving hole is opened on the locking member, the driving hole has a slope that is disposed against a sliding direction of the transmission member in an inclining manner, two slopes are disposed, the two slopes are disposed oppositely, and the driving shaft contacts the slopes.

12. An electronic device, comprising:
a rack, wherein a subrack that can be pulled out of the rack is disposed on the rack, a handle locking structure is disposed on the subrack, and a lock hole that is used by a bolt for snapping is opened on the rack, wherein the handle locking structure comprises:
a handle body connected to a shell,
a pressing member that is connected to the handle body in a sliding or rotating manner, and
a transmission member and a locking part that can slide against the shell, wherein the locking part comprises a bolt that elastically stretches out of an outer peripheral wall of the shell, the transmission member is connected to the pressing member, an unlocking structure that is used to enable the bolt to retract is disposed between the transmission member and the locking part, the transmission member is connected to the bolt through the unlocking structure, the transmission member can slide by pressing the pressing member, and the sliding transmission member functions on the bolt through the unlocking structure to enable the bolt to retract; wherein:
the unlocking structure comprises a locking member and a driving shaft, the driving shaft is connected to the transmission member in a fixed manner or is integrally formed on the transmission member, and the bolt is connected to the locking member in a fixed manner or is integrally formed on the locking member; and
an arc surface or a slope is disposed on the locking member, and the driving shaft contacts the arc surface or the slope of the locking member in a sliding manner;

wherein:
one end of the pressing member is connected to the handle body in a rotating manner, and the other end of the locking member is connected to the transmission member in a rotating manner; and
a driving hole is opened on the locking member, the driving hole has a slope that is disposed against a sliding direction of the transmission member in an inclining manner, and the driving shaft contacts the slopes.

\* \* \* \* \*